US011460527B1

(12) United States Patent
Peidous et al.

(10) Patent No.: US 11,460,527 B1
(45) Date of Patent: Oct. 4, 2022

(54) METHOD OF OBSERVING OBJECTS USING A SPINNING LOCALIZED OBSERVATION

(71) Applicants: Vassili Peidous, Liberty Township, OH (US); Nina Peydus, Liberty Township, OH (US)

(72) Inventors: Vassili Peidous, Liberty Township, OH (US); Nina Peydus, Liberty Township, OH (US)

( * ) Notice: Subject to any disclaimer, the term of this patent is extended or adjusted under 35 U.S.C. 154(b) by 600 days.

(21) Appl. No.: 16/555,211

(22) Filed: Aug. 29, 2019

Related U.S. Application Data

(60) Provisional application No. 62/726,219, filed on Sep. 1, 2018.

(51) Int. Cl.
| | | |
|---|---|---|
| *G01N 21/88* | (2006.01) | |
| *G01R 33/54* | (2006.01) | |
| *G06F 17/10* | (2006.01) | |
| *G01R 33/48* | (2006.01) | |
| *G01B 11/00* | (2006.01) | |
| *G01Q 10/06* | (2010.01) | |
| *G02B 26/10* | (2006.01) | |
| *G01N 21/95* | (2006.01) | |

(52) U.S. Cl.
CPC ............ *G01R 33/543* (2013.01); *G01B 11/00* (2013.01); *G01N 21/8851* (2013.01); *G01N 21/9501* (2013.01); *G01Q 10/065* (2013.01); *G01R 33/482* (2013.01); *G02B 26/10* (2013.01); *G06F 17/10* (2013.01); *G01N 2201/1045* (2013.01)

(58) Field of Classification Search
CPC .... G01R 33/543; G01R 33/482; G01B 11/00; G01N 21/8851; G01N 21/9501; G01N 2201/1045; G01Q 10/065; G02B 26/10; G06F 17/10
USPC .......................................... 356/608; 563/608
See application file for complete search history.

(56) References Cited

U.S. PATENT DOCUMENTS

| | | | | |
|---|---|---|---|---|
| 4,314,763 A | * | 2/1982 | Steigmeier | G01N 21/9501 356/342 |
| 5,671,056 A | * | 9/1997 | Sato | G06T 7/521 356/394 |
| 6,606,153 B2 | * | 8/2003 | Marxer | G01N 21/9501 356/237.3 |
| 7,952,515 B2 | * | 5/2011 | McEwan | G01S 13/89 342/134 |
| 8,885,158 B2 | * | 11/2014 | Wolters | G01N 21/9501 356/237.4 |
| 9,329,462 B2 | * | 5/2016 | Matteo | G03B 21/14 |
| 9,625,491 B2 | * | 4/2017 | Sakai | G01Q 10/00 |
| 9,716,008 B2 | * | 7/2017 | Iguchi | H01L 29/1608 |

(Continued)

*Primary Examiner* — Susan E. Torgerson

(57) ABSTRACT

An efficient method of scanning is provided that may be used for treatment, analysis, inspection and testing physical objects and spaces. High precision, resolution and throughput of scanning are achieved by employing a dual motion of probing devices and scanned objects. A probing device spins with high speed about an axis of spinning directed towards a scanned object. Concurrently, the spinning axis is set in a relatively slow motion with respect to the scanned object. Both the spinning of the probing and the motion of the spin axis are implemented in a controlled and predetermined way to achieve objectives of scanning. Accordingly, arbitrary large and shaped objects may be efficiently scanned with high precision and throughput.

12 Claims, 5 Drawing Sheets

(56) References Cited

U.S. PATENT DOCUMENTS

| | | | | |
|---|---|---|---|---|
| 2007/0236789 | A1* | 10/2007 | Moon | G02B 26/0891 |
| | | | | 359/393 |
| 2011/0176147 | A1* | 7/2011 | Marcil | G01B 11/25 |
| | | | | 356/602 |
| 2012/0076345 | A1* | 3/2012 | Fritz | F03D 80/50 |
| | | | | 382/100 |
| 2017/0304937 | A1* | 10/2017 | Miyashita | B23K 26/035 |
| 2018/0347591 | A1* | 12/2018 | Serrano | B23K 26/36 |

* cited by examiner

METHOD OF OBSERVING OBJECTS USING A SPINNING LOCALIZED OBSERVATION

FIELD OF THE INVENTION

The present invention relates to process and instrumentation technologies for treatment, analysis, inspection and testing physical objects and spaces. In particular, it discloses a novel concept and algorithms of scanning surfaces of objects using technological or analytical beams of electromagnetic radiation. The scanning may be used for materials processing on purpose of product fabrication. The scanning may be used as well for workpiece or materials analysis and characterization. The disclosed concept and algorithms may be used as well for scanning spaces on purpose of object detection, identification and imaging.

BACKGROUND OF THE INVENTION

There are numerous applications in science, medicine, technology and other fields of human operation which require scanning. Those applications include image recognition, reading and copying using systematic search in space or on surfaces of objects. Another class of scanning methods is used for detection, characterization, examination or investigation of objects by systematic illumination of their surfaces with probing beams of electromagnetic radiation as applied in laser scanners. Scanning radars are used for identification and tracking objects in space.

Systematic positioning and translation of electromagnetic beams or other localized means on surfaces of objects for writing, printing, drawing, painting, object processing, heating, and surface modification is yet another category of technologies utilizing scanning. For the purpose of simplicity and clarity, the term "probing medium" in the following description is used to denote any means of localized observation, probing or processing. The terms "probed area" are "probed space" are used to denote a localized surface area or a portion of space within which a probing medium interacts with a scanned object. During any process of scanning, a probing medium and a scanned objects are placed in state of relative motion. Accordingly, the related probed area continuously changes its location in space or on the surface of a scanned object. The term "probed area position" is referred to an instantaneous location where the probed area is situated at a specified moment or instance in time.

A systematic search and positioning during a process of scanning implies that a probing medium follows a controlled and predetermined path in space or on the surface of a scanned object. Most scanning applications are deemed to scan targeted areas of space or objects entirely, without gaps, so that every portion of the space or object in question is probed. Another critical parameter of scanning is resolution. Hence, probing media in advanced scanning methods are narrow focused and highly localized. Additional critical characteristic of scanning is throughput. It is proportional to the speed at which a localized observation or probing media follows its predetermined path in space or on the surface of an object. A related key parameter of scanning methods is a precision of scanning media positioning in space or on a scanned surface. Usually, these critical parameters of scanning are in a tradeoff relationship. The present invention facilitates the entireness of scanning while improving the scanning resolution, precision and throughput. For the purpose of simplicity, the following description will explain the present invention mostly in a relation to surface scanning. However, the disclosed method of scanning is also applicable and provides the same benefits for scanning three dimensional objects and spaces.

Scanning along perpendicular directions X-Y is the most widespread in conventional applications which require high precision and resolution. Examples may be found in U.S. Pat. No. 9,716,008 "Apparatus for doping impurities, method for doping impurities, and method for manufacturing semiconductor device"; U.S. Pat. No. 9,625,491 "Scanning mechanism and scanning probe microscope"; U.S. Pat. No. 9,329,462 "Proton treatment location projection system"; U.S. Pat. No. 7,952,515 "Range gated holographic radar". Such a scanning scheme is illustrated in FIG. 1. Scanning of an object 101 is conducted in a Cartesian coordinate system 102 associated with the object. Scanning starts at the location 103 that represents a probed area related to the position of a probing medium at the beginning of scanning. Then scanning continues in X direction 104 along the scanning path 105. When the probed area reaches the predetermined position 106, the scanning along X direction stops and the scanning path is shifted along Y direction 107. Then scanning continues along the direction 108 reverse to X axis. This process continues until the intended area of the object 101 is scanned and the scanning medium brings the probed area at the final position 109. This scheme of scanning is simple and convenient for implementation, control and visualization. However, it may not provide high throughput. Changing scanning directions implies deceleration, stops and acceleration of equipment components which provide the motion of probing media with respect to scanned objects. This delays scanning processes. Increasing the speed of scanning may lead to inertia forces uncontrollably shifting positions of moving components in scanning apparatus resulting in a poor accuracy of scanning.

Rotating or rocking mirrors may provide high motion speed for probing beams of optical radiation. However, the known related solutions change the profiles of energy distributions in the probing beams and other conditions of scanning such as angles of beam incidence on surfaces of scanned objects. Variable and inconsistent conditions of scanning degrade the scanning resolution and precision.

Superior throughput, resolution and precision of scanning have been achieved in systems for inspection of semiconductor wafers which utilize a spiral scheme of scanning. Examples may be found in U.S. Pat. No. 4,314,763 "Defect detection system"; U.S. Pat. No. 6,606,153 "Process and assembly for non-destructive surface inspections"; U.S. Pat. No. 8,885,158 "Surface scanning inspection system with adjustable scan pitch". The concept of spiral scanning is illustrated in FIG. 2. The scanned object is a semiconductor wafer 201 placed under a stationary probing medium—a laser beam. A rotation stage holds the wafer 201 and spins it about the wafer center 204 in the direction 206. The rotation stage is sitting on a translation stage that concurrently moves the rotation stage and the wafer in the direction 203 perpendicular to the axis of wafer spinning. An inspection starts with a laser spot located, for example, at the center 204 of the wafer and then proceeds until the probed area—the laser spot—on the wafer surface reaches the location 202 at the outer perimeter of the wafer 201. The speeds of spinning and translation are synchronized such that the scanning goes track-by-track along the spiral path 205 on the surface of the wafer 201. Instantaneous laser spots 208 shown on the last two circles of the spiral path 205 define the edges 207 of the scanning tracks. The distances 209 and 210 between adjacent scanning tracks are aligned with the size of probed area—the laser spots 208. Thus, the entire surface of the wafer 201 is scanned without gaps.

A throughput of spiral scanning is proportional to the speed with which a scanned object is spun. Fast spinning is practical for light and axially symmetrical objects only. This is a major limitation of spiral scanning. Even for semiconductor wafers with highly precise forms and symmetry, high spinning speed may lead to accuracy failures and safety issues. Another drawback of spiral scanning is large dimensions of characterization systems. Spinning stages must have means to firmly hold characterized objects and need to be combined with translation stages for a linear object movement at a distance not less than a half of an object size. Accordingly, scanning systems applying spiral scanning are usually stand-along large tools which may not be easily integrated with production equipment and have high cost of ownership in operation.

The present invention has an objective to provide a method of scanning with high throughput, precision and resolution. The provided method enables: (i) achieving high scanning throughput and high scanning efficiency without a need for fast motion or spinning of scanned objects, (ii) miniaturization and cost reduction of scanning systems and (iii) easy integration of scanning systems with analytical or production equipment for implementing in-situ or in-process scanning. This is also an objective of the present invention to ensure the compatibility of the provided scanning method with the requirements of high resolution and precision: a probing medium interacts with scanned objects consistently and uniformly across all surface areas and spaces intended for scanning. In particular, the angles of incidence of probing media on the surface of a scanned object, the size and shape of probed areas and energy distributions in the probing media are constant during the whole scanning process.

SUMMARY OF THE INVENTION

The present invention provides a method for high precision, high resolution and high throughput scanning of surfaces or volumes of arbitrary objects or spaces. A probing medium of scanning, such as a means for a localized observation or a probing beam or a processing beam, is spun, about an axis directed normally towards the scanned object. On the surface of the scanned object, a probed area, such as a spot of instantaneous illumination by a beam of a radiation, follows a circle. Concurrently, the scanned object and the axis of probing media spinning are set in a relative motion. Both the probing medium spinning and the relative motion of the spin axis with respect to the scanned object are implemented in a controlled way. Accordingly, the probed area follows a controlled and predetermined path on the object surface meaning that the probing medium scans the surface. A high scanning throughput is achieved through a high speed of probing media spinning. A scanned object may be in a stationary position or may be moved slowly. Therefore, arbitrary large and shaped objects may be efficiently scanned.

DETAILED DESCRIPTION OF THE INVENTION AND ITS EMBODIMENTS

Figure 1:
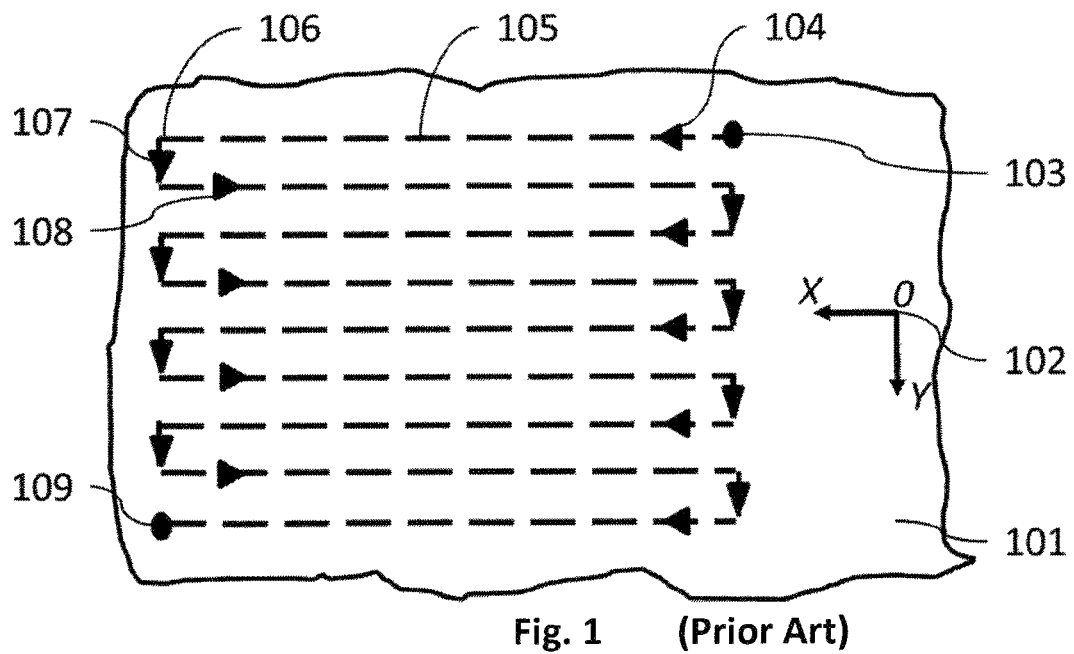
FIG. 1 is an illustration of a conventional scheme of object scanning with a rectangular pattern in which a motion of a probing medium is implemented in two mutually perpendicular directions.
Figure 2:
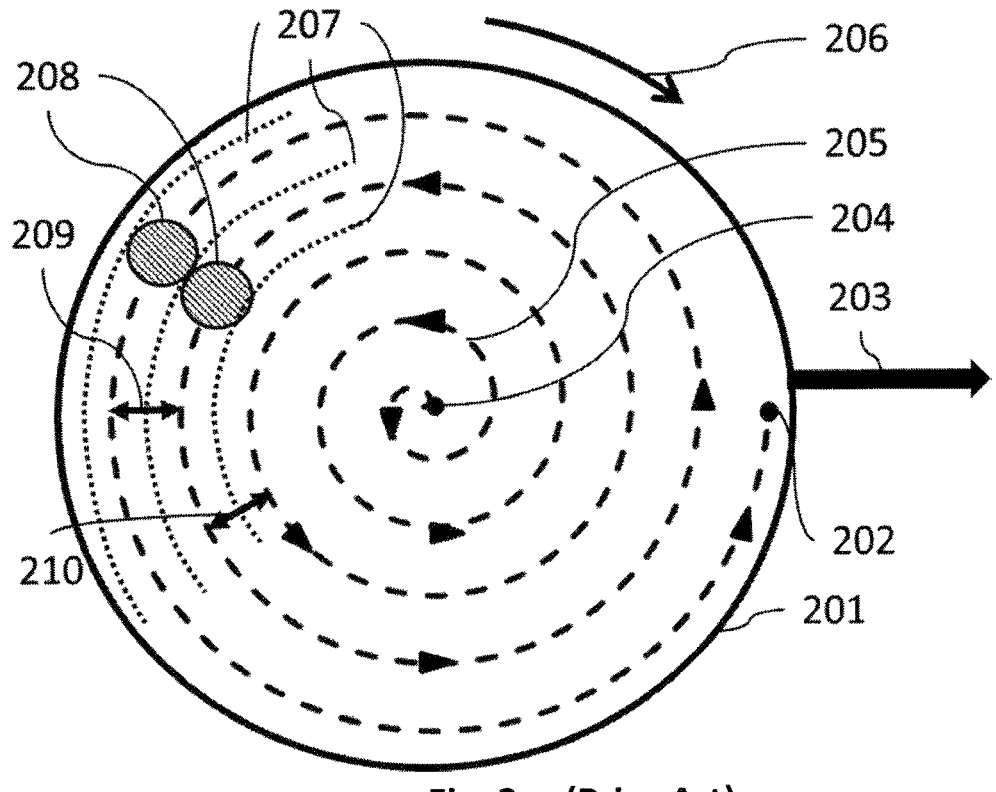
FIG. 2 is an illustration of a conventional scheme of high throughput spiral scanning.

Proposed is a method of scanning of surfaces, 3D objects and spaces with probing media. A probing medium may be a means with a narrow field of observation or a beam of electromagnetic radiation. The said objects may be, but not limited to: metal, dielectric and semiconductor workpieces for manufacturing tools, machines, equipment, devices or other products; mirrors and substrates with biological, medical and other research species on the surface. Said objects may have flat or nearly flat surfaces. The said observation may be related to a microscopic, visual or telescopic analysis of surfaces, 3D objects or spaces. The purpose of the said analysis may be a search of characteristic features or substances. The said electromagnetic radiation may be, but not limited to: X-ray, ultraviolet light, visible light, infrared light, microwaves, radio waves, etc. The purpose of beam scanning may be, but not limited to: radar location and orientation, imaging, visualization, mapping, sensing, probing, detecting surface features, inspection, measuring parameters or determining properties.

The benefits of scanning methods according to the present invention are achieved with a novel concept of scanning based on dual concurrent motions of probing media and scanned objects. The first motion is a controlled spinning of a probing medium set in a way that it scans an object surface along a circular orbit or sweeps a conical surface in a 3D object or in space. A system that provides a probing medium may preferably be made axisymmetric so it can be spun at high speed about the axis of its symmetry without causing vibrations. The second concurrent motion is a controlled repositioning of a scanned object relative to the axis of probing medium spinning, the axis is also referred below as "spin axis". The said repositioning is rationally slow compared to probing media spinning. Its preferred speed may depend on the speed of probing media spinning. It may be implemented by moving a scanned object while the axis of probing media spinning is kept stationary or vise-versa. Both a scanned object and the axis of probing media spinning may be simultaneously moved provided that the resulting movement allows a controlled repositioning of the scanned object with respect to the axis of probing medium spinning.

Uninterrupted motion of a probing medium along a relatively small spinning orbit allows to position the probing medium with high precision on the surface of a scanned object or in space. Systems providing probing media may be purposely designed with axial symmetry so they may be set at high speeds of spinning. Fast spinning motion is not restricted by the size, shape or weight of scanned objects. Therefore, high throughput and efficiency of scanning process may be achieved for arbitrary objects. Systems providing probing media may be of much smaller size compared to the stages for holding, translating or rotating scanned objects. This opens opportunities for fabrication of compact and inexpensive scanning tools which may be conveniently placed into production or processing equipment for in-situ or in-process scanning.

Figure 3:
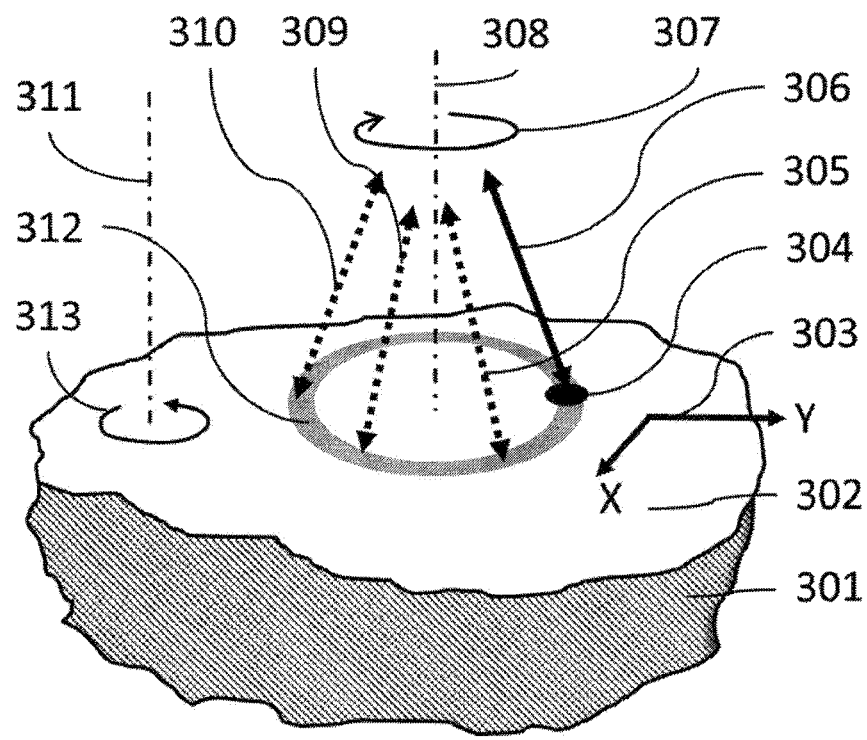
FIG. 3 is an illustration of possible types of relative motions of a probing medium and a scanned object according to the present invention.

According to the present invention, as illustrated in FIG. 3, an object 301 for scanning has a flat or near-flat surface 302 that may represent only a portion of an overall object surface. The surface 302 is scanned with a probing medium 306 that is spun about an axis 308. The spinning direction 307 is arbitrary chosen clockwise in this embodiment but it may be counterclockwise. The axis 308 is configured perpendicular to the object surface 302. Instantaneous positions 305, 309 and 310 of the probing medium 306 illustrate its progressive motion during spinning. The probing medium 306 illuminates the surface 302 at a probed area 304 that circles along the orbit 312 as the probing medium 306 spins. In the followed description, the orbit 312 is also called as a "probing orbit" or a "probed area orbit".

Concurrently, the object 301 is repositioned with respect and perpendicular to the axis 308 of probing beam spinning so that the surface 302 is maintained in the same geometric plane. A preferred repositioning of the object may be either continues or a step-by-step linear movement along a line or mutually perpendicular directions X and Y in a Cartesian coordinate system 303 associated the object surface 302.

Another preferred repositioning of the object 301 is its rotation about a rotation axis 311 that does not coincide with the axis 308 of probing medium spinning. The direction 313 of the object rotation may be chosen either clockwise or counterclockwise. A combination of rotation and linear repositioning may also be applied. The rotational repositioning may be especially beneficial for scanning objects with axial symmetry, such as round disks or rings.

The probing medium 306 may be arranged oblique or perpendicular to the surface 302 of the scanned object 301. In either case, it must not coincide with the axis 308 of probing medium spinning so that the probed area 304 is apart from the intersection of the spin axis 308 and the surface 302 of the scanned object 301. The probing medium 306 and the axis 308 of its spinning may be in one geometric plane or different plains. The spinning direction 307 and the rotation direction 313 may be independently chosen clockwise or counterclockwise. Repositioning of the object 301 with respect to the axis 308 of probing medium spinning may be implemented by moving the object 301 while keeping the apparatuses that spin the probing medium 306 and define the position of the axis 308 stationary. In other embodiments, an apparatus that provides and spins the probing medium 306 may be moved while the object 301 is kept stationary. A combination of simultaneous movements of the object 301 and the axis 308 may also be applied. For simplicity in the further description, either option of object repositioning with respect to the axis of probing medium spinning is called "object repositioning" or "object movement". The highest efficiency of scanning according to the present invention may be achieved with a high speed of probing medium spinning. The object repositioning is implemented at lower speed as explained in the following description.

Figure 4:
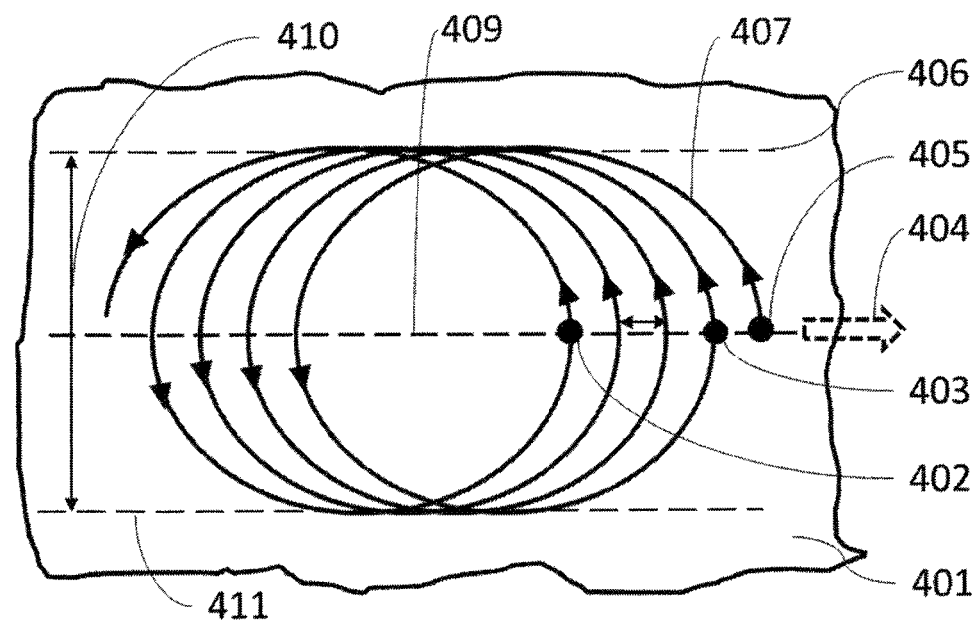
FIG. 4 is an illustration of an embodiment of scanning that applies a linear repositioning of a scanned object at a constant speed with respect to an axis of probing media spinning according to the present invention.

FIG. 4 illustrates a scanning path of a robing area in case of a linear repositioning of a scanned object with respect to an axis of probing medium spinning according to the present invention. The surface 401 is a top-down view of an object for scanning. A probing medium, not shown, is spun counterclockwise. Its spinning axis is perpendicular to the surface 401 and held stationary. The object for scanning is repositioned with a constant speed in the direction 404 perpendicular to the axis of probing medium spinning. In the result, the probed area on the surface 401 follows a path 407. It starts at an initial position 405 of the probed area and follows a circle that progressively shifts on the surface 401 in the direction opposite to the direction 404 of object repositioning. The first revolution of the spinning probing medium brings the probed area to the position 403. The probed area reaches the position 402 in four spinning revolutions. On its way, the axis of probing medium spinning follows a line 409 moving in the direction opposite to the direction 404 of object repositioning. Consequently, the surface 401 is scanned along a wide band that has the top edge 406 and the bottom edge 411. The width 410 of the scanning band equals to the diameter of the probing orbit that is drastically larger than a width of an instantaneous probed area. Therefore, even though the speed of the object repositioning may be relatively slow, the scanning architecture according to the present invention provides high efficiency and high throughput of scanning.

Figure 5:
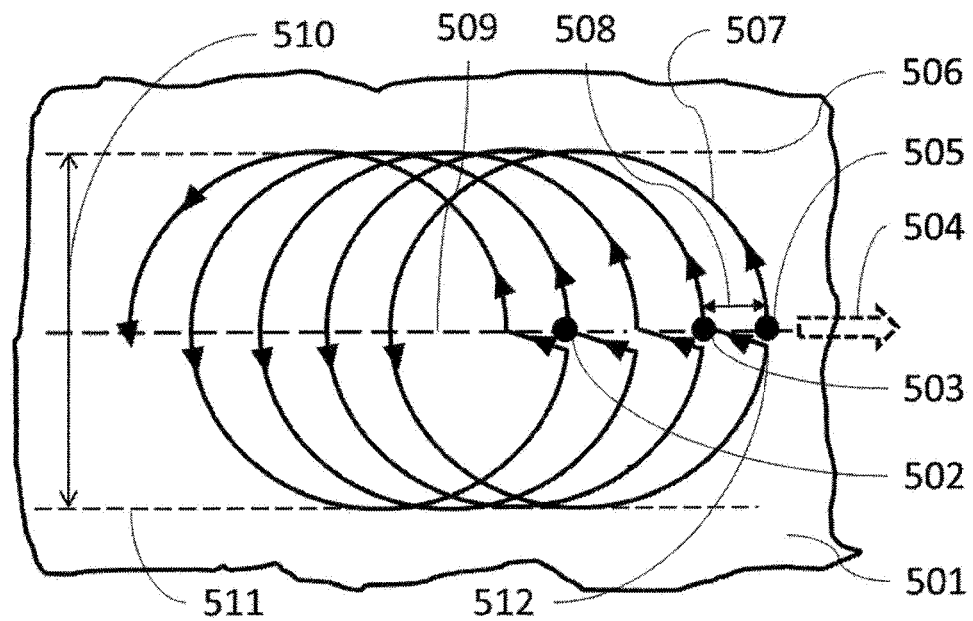
FIG. 5 is an illustration of an embodiment of scanning according to the present invention in which a scanned object is repositioned with respect to an axis of probing media spinning by steps along a straight line.

Another embodiment of the scanning method according to the present invention is illustrated in FIG. 5. A motion of a characterized object with respect to a probing medium is conducted by steps. The frequency of steps of the object repositioning is aligned with the speed of probing media spinning. Every subsequent step of object repositioning is triggered by a completion of a revolution of the probing medium around the axis of its spinning. The surface 501 is a top-down view of an object for scanning. The probing medium is not shown. It spins counterclockwise about a stationary spinning axis arranged perpendicular to the surface 501. The object for scanning is repositioned by steps in a direction 504 perpendicular to the axis of probing media spinning. The scanning starts at the instantaneous probed area position 505 and follows a path along the first probing orbit 507. At the instance when the probed area approaches an immediate proximity 512 to its initial position 505, the object is repositioned in the direction 504 by a distance 508. Consequently, the probed area on the surface 501 gets to the position 503 and then follows another probing orbit. The process of scanning proceeds in the same way. In particular, the instantaneous position 502 is achieved by the probed area at a start of the fourth revolution of the probing medium spinning. The projection of the axis of spinning on the surface 501 follows the line 509 in the direction opposite to the direction 504 of object repositioning. The scanning occurs along a wide scanning band within the boundaries 506 and 511. The width 510 of the scanning band equals to the diameter of the probing orbit. Fast spinning of the probing medium provides high efficiency of scanning at relatively low speed of object repositioning.

The alignment between the frequency of steps in object motion and the speed of probing media spinning is not necessary but it may provide a consistency of scanning density, better precision, better resolution and easier implementation. A preferred frequency F of steps in object linear repositioning is F=R/n, where R is the speed of probing media spinning in rpm (revolutions per minute) and n is natural number. The highest scanning throughput is achieved at n=1. For example, if the speed of probing media spinning is 600 rpm, then the highest preferred frequency of steps of object linear repositioning is 600 per minute or 10 Hz.

Figure 6:
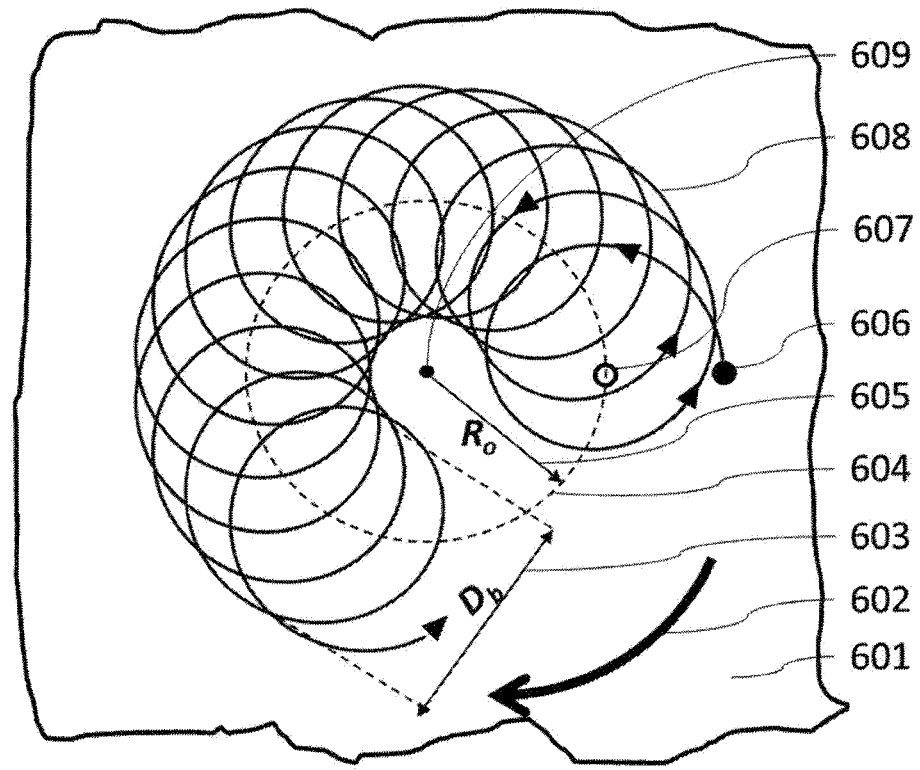
FIG. 6 is an illustration of an embodiment of scanning according to the present invention in which a rotational motion of a scanned object is applied for its repositioning with respect to an axis of probing media spinning.

Another preferred embodiment of the scanning method according to the present invention is illustrated in FIG. 6. A rotational motion is applied for repositioning of a scanned object with respect to the axis of probing medium spinning. The top-down view shows the surface 601 of a scanned object. The object is rotated about the rotation axis 609, the rotation axis is perpendicular to the surface 601. The direction 602 of rotation in this example is arbitrary chosen to be clockwise. A probing medium, not shown, is spun about a spin axis perpendicular to the surface 601 of the scanned object. At the beginning of scanning, the spin axis has the position 607 that is located at the distance 605 (Ro) from the rotation axis 609. Due to the continuous rotation of the object, the spin axis follows a path along the circle 604 on the surface 601. An instantaneous probed area at the start of scanning has the position 606. With the beginning of the rotational repositioning of the object, the scanning process starts and the instantaneous probed area follows the spiral path 608 on the object surface 601. The scanning proceeds within a band having the shape of a ring with the width 603 ($D_b$) that is equal to the diameter of the related probing orbit. The scanning band swept by the spinning probed area is much wider than the instantaneous probed area. Spinning is the most simple and geometrically precise motion that can be conventionally implemented in practical mechanical systems. Therefore, probing medium spinning may be set at very high speed to provide high precision, efficiency and throughput of scanning.

A rotational repositioning of an object for scanning with respect to the spin axis of a probing medium may also be conducted by steps. A preferred frequency F of steps in object rotation is F=R/n, where R is the speed or frequency of the probing medium spinning in rpm (revolutions per minute) and n is a natural number. The highest scanning throughput is achieved with n=1. For example, if the frequency of probing medium spinning is 3000 rpm, then the highest frequency of steps in a preferred object rotation is 3000 per minute or 50 Hz.

Space scanning is analogous to object scanning. From the perspective of a probing medium, the position of its origin in space is a center of an infinite sphere; the relative motion between the probing medium and the sphere is equivalent to redirecting the axis of a probing medium spinning; an instantaneous probed area is a beam of a three-dimensional portion of the space that has a cylindrical shape if a probing medium is collimated or a conical shape if the probing medium is focused or diverging.

Figure 7:
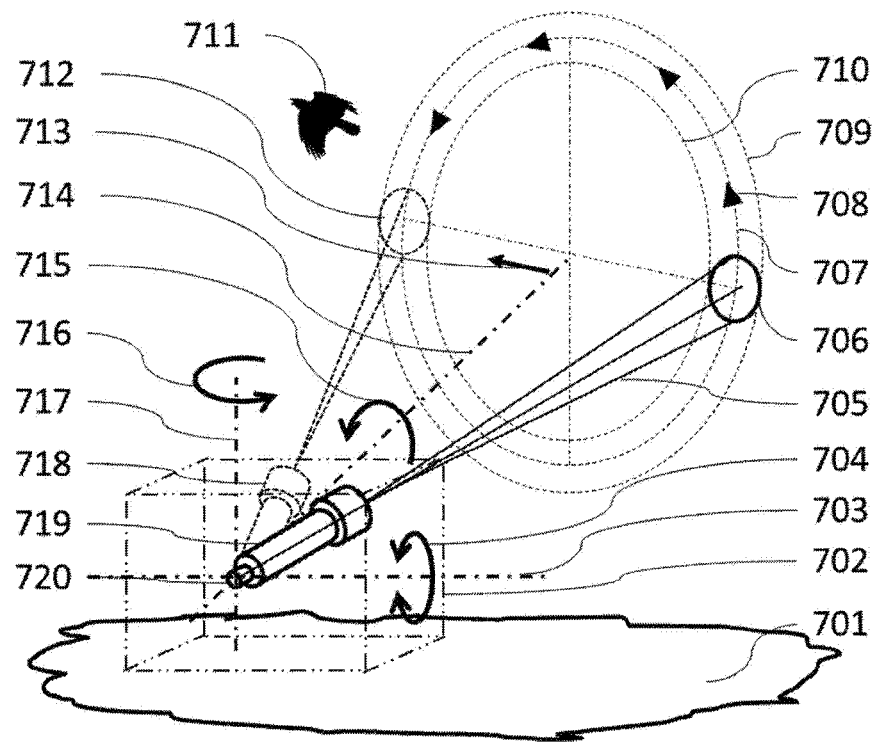
FIG. 7 is an illustration of an embodiment of the present invention with a passive scanning of space in the regime of observation for detecting flying objects.

FIG. 7 illustrates an embodiment of the present invention with a passive space scanning in the regime of observation. On the ground 701, the apparatus 702 for detecting flying objects is installed. It mechanically holds the spyglass 719 and spins it about the axis 714 in the direction 715. At the eyepiece of the spyglass 719, the light sensor 720 is attached. It may be a semiconductor charge-coupled device (CCD), an active pixel CMOS sensor or any other light sensor that detects changes in light intensity associated with flying objects getting into the field of spyglass observation. So, the probed area of the system is the field of spyglass observation. The data processing module, not shown, indicates a presence of a flying object in conjunction with a direction of the spyglass observation.

An initial field of spyglass observation is the instantaneous probed area 705 with the imaginary cross-section 706 at some distance. As the spyglass 719 spins, the instantaneous probed area changes its position and its imaginary cross-section moves along the circular orbit 707 in the direction 708. At every moment of scanning, the probed area has a specific instantaneous position, such as the position 712 corresponding to the spyglass position 718. For conducting a space scanning, the apparatus 702, simultaneously with the spyglass spinning, changes the azimuth of the spyglass spin axis 714 by turning the system of the spyglass spinning about the vertical axis 717 in the direction 716. That corresponds to the repositioning 713 of the spin orbit 707 of the probed area in space. The probing medium is the spyglass that collects the light radiation. As the probing medium spins, it sweeps a portion of space that has an angular width shown in its imaginary cross-section as a ring with the outer circle 709 and inner circle 710. Preferably, the azimuthal turning 716 is synchronized with the frequency of spinning 715. It is preferred that the repositioning 713 implemented during one spin revolution is equal or less than the angular width of the probed area 705.

Analogously, the altitude of the spin axis 714 may be changed by turning the spyglass about the horizontal axis 703 in the direction 704. When the probed area 705 reaches the position of a flying object 711, the light intensity in the probing medium changes and the data processing module indicates this event along with the corresponding instantaneous azimuth and altitude of the probed area. An effective scanning area of the probed orbit is much greater than the angular width of the spyglass observation. Therefore, fast spinning of the spyglass allows conducting scanning with high throughput and efficiency.

Figure 8:
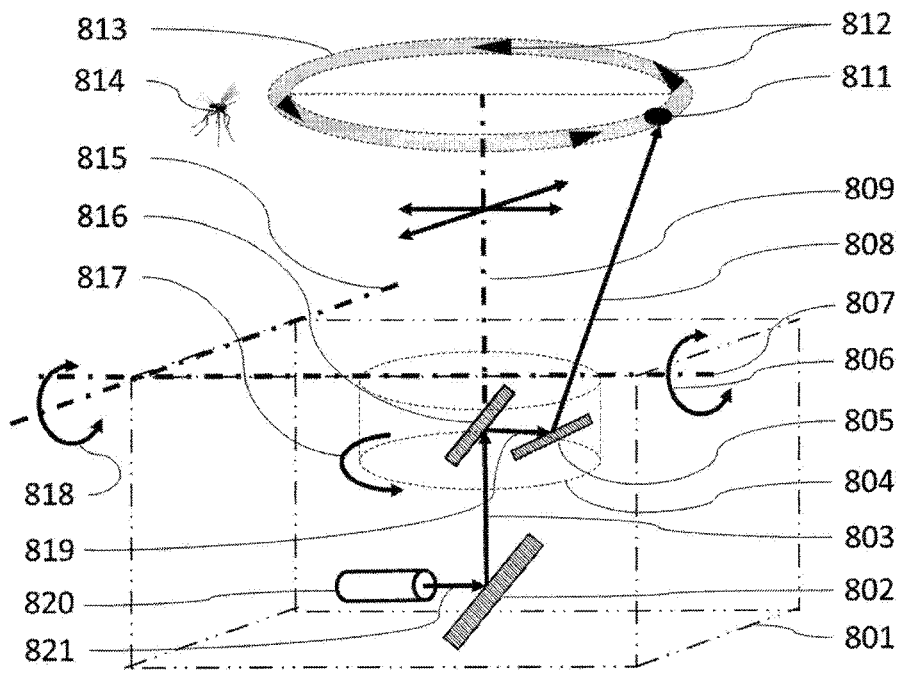
FIG. 8 is an illustration of an embodiment of the present invention with an active space scanning using a beam of radiation for eliminating flying objects.

FIG. 8 illustrates another embodiment of the present invention that relates to active scanning of space for eliminating flying objects. A scanning apparatus is confined within the enclosure 801 and comprises the powerful laser 820 that provides the laser beam 821 in a horizontal direction. The laser beam is reflected vertically by the mirror 802. Both the laser 820 and the mirror 802 are mechanically arranged in a fixed relationship with respect to the enclosure 801. The vertically reflected laser beam 803 enters the optical system 804 that includes the reflecting mirror 816 and the directing mirror 805. The optical system 804 with mirrors 816 and 805 is spun in the direction 817 about the spin axis 809. The spin axis 809 is mechanically configured to be in a fixed relationship with the enclosure 801. Therefore, the laser beam 819 reflected by the mirror 816 and the laser beam 808 directed by the mirror 805 spins with the optical system 804. The spinning laser beam 808 represents a probing medium in this application. The function of the probing media is to destroy flying objects.

For better illustration, an imaginary geometric plane (not shown) perpendicular to the spin axis 809 of the optical system 804 is crossed by the laser beam 808 in the area 811. While spinning, the laser beam 808 sweeps the imaginary geometric plane along a circular orbit 813 so that the area 811 follows the arrows 812. The apparatus in the enclosure 801 may be controllably repositioned by turning it about the first rotation axis 815 in the desired direction 818. Accordingly, the axis 809 of the laser beam spinning changes its orientation in space. The apparatus may also be independently turned about the second rotation axis 807 in a desired direction 806. The second rotation axis 807 is perpendicular to the first rotation axis 815. Therefore, the spin axis 809 may be controllably positioned along any desired direction in space. This is implemented using an electronic module (not shown) that manages rotation motors through motor controllers. The spinning laser beam 808 sweeps a probed area that has the shape of a conical surface and it probes much larger portion of space compared to an instantaneous larger portion of space where the laser beam propagates. As the direction of the spin axis is changed, the probed area moves implementing an effective space scanning. The flying object 814 gets destroyed as soon as the laser beam 808 crosses it in the process of scanning.

Figure 9:
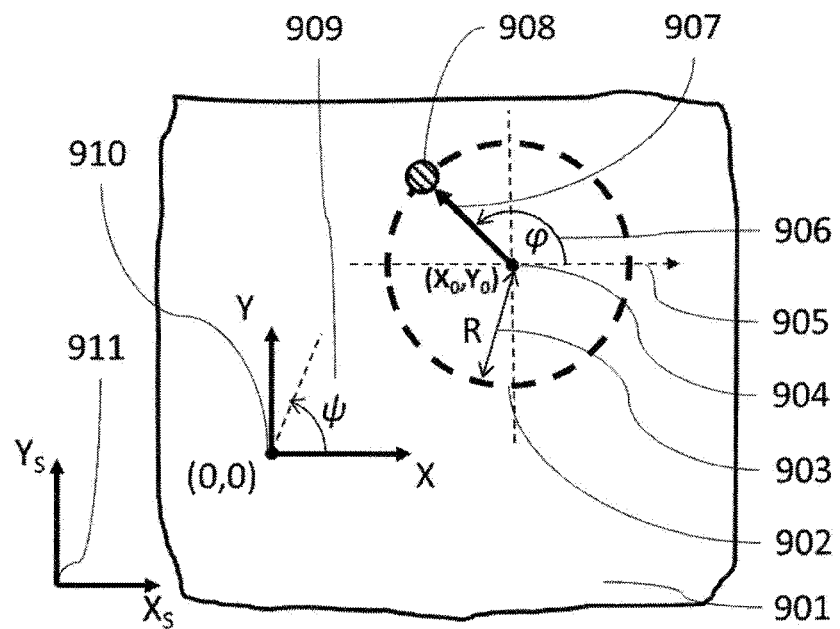
FIG. 9 is an illustration of an embodiment of defining instantaneous coordinates of a probed area on the surface of an object scanned according to the present invention with linear and rotational repositioning of the object with respect to the axis of probing media spinning.

FIG. 9 illustrates a setup for scanning of an arbitrary surface 901. A Cartesian coordinate system 910 with axes X, Y and the origin (0, 0) is associated with the scanned surface 901. Practical methods of scanning require to know a path that a probing medium follows on a scanned surface during a scanning process so that the scanning is conducted in a controllable and predetermined way. Therefore, it is necessary to determine the coordinates (X, Y) of an instantaneous position of a probed area at any moment t of an intended scanning process. In general, both the scanned surface and the probing medium may be in motions during scanning. These motions are described with respect to a stationary global coordinate system 911 that is external with respect to the scanning tool and the scanned object.

According to the present invention, a probing medium spins about an axis perpendicular to the scanned surface 901. Initially, before the scanning starts, i.e. at t=0, the spin axis has a position 904 with coordinates $(X_0, Y_0)$ in the coordinate system 910. When the probing medium spins, the probed area on the surface 901 moves along the scanning orbit 902 that is a circle having a radius 903 (R). Any instantaneous position 908 of the probed area is associated with a vector 907 connecting the center of the scanning orbit 902 with the probed area. An angle 906 ($\varphi$) between this vector and an arbitrary chosen global direction 905, defines an angular position of the probed area 908. In FIG. 9, the chosen direction 905, the axis X associated with the scanned surface, and the axis $X_S$ of the global coordinate system 911 are aligned in the same direction. Spinning motion of a probing medium may be implemented by conventional motors equipped with encoders which provide angular positions $\varphi$ of the probed area. The angle 906 ($\varphi$) is measured counterclockwise that is considered as a positive spinning direction. In case of counting the angular position clockwise, $\varphi$ shall be treated as a negative value.

A preferred repositioning of the surface 901 with respect to the spin axis 904 is a linear motion. This is conventional in equipment automation to conduct linear repositioning by motors equipped with encoders. The encoders provide data on the distance of repositioning $S_X(t)$ and $S_Y(t)$ in directions X and Y correspondingly at any time t in question. The present invention establishes the following algorithm for determining instantaneous coordinates (X(t), Y(t)) of the probed area at any instant time t of scanning:

$$X(t)=R\cdot\cos(<\varphi(t))+X_0-S_X(t)$$

and $$Y(t)=R\cdot\sin(<\varphi(t))+Y_0-S_Y(t),$$

where
R is the radius of the probed area orbit on the scanned surface,
$\varphi(t)$ is the angular position of the probed area measured counterclockwise with respect to X direction,
$X_0$ and $Y_0$ are X and Y coordinates of the spin axis of the probing medium at the beginning of scanning (t=0), $S_X(t)$ and $S_Y(t)$ are the transfers of the scanned object in X and Y directions correspondingly with respect to the spin axis of the probing medium.

For example, a workpiece is scanned with a laser to anneal its surface for material strengthening. The probing medium at scanning is a laser beam that is spun about an axis perpendicular to the workpiece surface. A Cartesian coordinate system X, Y is assigned to the workpiece surface. Initial coordinates of the axis of laser beam spinning are $X_0$=100 mm and $Y_0$=150 mm. The laser beam is spun by an electric motor with an encoder that monitors angular positions of the spinning laser beam. The "zero" angular position is set along the axis Y. Angles of laser beam directions are measured clockwise in a top-down perspective. The orbit of the laser beam spot on the workpiece surface has a diameter of 120 mm (radius equals to 60 mm) by the scanner design. The workpiece is repositioned along Y axis only. The repositioning is implemented by a linear actuator with a precise control of a linear position. At a moment corresponding to 3 minutes of scanning, the encoder indicates the laser angular position of 209.4° and the linear actuator indicates that the workpiece was repositioned by 139.2 mm. A computer tracks the instantaneous positions of the laser on the workpiece surface according to the algorithm established by the present invention. The provided equations require a trivial modification. First, because of the angular position of the laser beam is measured with the reference to Y direction, the angle $\varphi(t)$ in the equations needs to be increased by 90°. Second, the angle $\varphi(t)$ in the equations needs to have the negative sign because the angular position of the laser beam is measured clockwise. Therefore, $$X(t)=R\cdot\cos(90°-\varphi(t))+X_0-S_X(t)=60\cdot\cos(90°-209.4°)+100-0=70.546\text{ mm}$$

and $$Y(t)=R\cdot\sin(90°-\varphi(t))+Y_0-S_Y(t)=60\cdot\sin(90°-209.4°)+150-139.2=-41.473\text{ mm}$$

Accordingly, the instantaneous coordinates of the laser beam spot on the surface of the annealed workpiece at t=3 min are X=70.546 mm and Y=-41.473 mm.

Another preferred repositioning of a scanned surface with respect to the spin axis of a probing medium according to the present invention is a rotation of the scanned surface about an axis perpendicular to the scanned surface. An embodiment of such an option is also illustrated in FIG. 9. The axis of scanned surface rotation is located at the origin (0,0) of the Cartesian coordinate system 910 associated with the scanned surface 901. Initially, at t=0, X axis is directed along the global direction $X_S$. Conventionally, the rotation is implemented by a motor having an encoder. The encoder provides data on the angle of rotation 909 ($\psi$). In this embodiment $\psi$ is measured counterclockwise with respect to a reference global direction $X_S$. In case of clockwise measurements, $\psi$ is a negative value. The present invention establishes the following algorithm for determining instantaneous coordinates (X(t), Y(t)) of the probed area at any instant time t of scanning:

$$X(t)=(X_0+R\cdot\cos[\varphi(t)])\cdot\cos[\psi(t)]-(Y_0+R\cdot\sin[\varphi(t)])\cdot\sin[\psi(t)]$$

and $$Y(t)=(X_0+R\cdot\cos[\varphi(t)])\cdot\sin[\psi(t)]+(Y_0+R\cdot\sin[\varphi(t)])\cdot\cos[\psi(t)],$$

where $X_0$ and $Y_0$ are X and Y coordinates of the axis of probing medium spinning at the beginning of scanning, i.e. at t=0, R is the radius of the probed area orbit on the scanned surface, φ(t) is the angular position of the probed area measured counterclockwise from X(0) direction of axis X at the beginning of scanning, i.e. at t=0, and ψ(t) is the angle of the scanned object rotation measured counterclockwise with respect to the scanned surface orientation at the beginning of scanning, i.e. at t=0.

For example, a 300 mm semiconductor wafer is scanned with the purpose to detect and identify locations of surface defects. A Cartesian coordinate system X, Y with the origin in the center of the wafer is assigned to the wafer surface. The probing medium is light collected from the surface of the wafer by an objective lens that spins about an axis not matching with the lens optical axis. Initial coordinates of the lens spinning axis are $X_0$=75 mm and $Y_0$=0 mm. According to the design of the scanning tool, the observation orbit (the probed area orbit) of the spinning lens has the radius of 75 mm. The lens is spun counterclockwise by a first motor equipped with a sensor that feedbacks an angular position of the lens. The position of the lens is treated as the position of its optical axis. The "zero" angle is set at the lens position along the direction of the X axis with respect to the spin axis. The lens angular position is measured counterclockwise. The scanned wafer is slowly rotated about its center by the second motor with an encoder that monitors and feedbacks the rotation angle of the scanned wafer, the rotation angle is measured counterclockwise. The initial rotation angle is set to "zero". All measurements are performed exactly as defined in the algorithm established in the present invention. Therefore, the equations of the algorithm may be directly applied to determine the coordinates X(t) and Y(t) of the probed area (coordinates of the lens) at any time t. In particular, at the scanning time of 30 seconds, the sensor of the motor that spins the lens indicated φ(t)=122.8° and the encoder of the motor that rotates the scanned wafer indicated ψ(t)=180°. Applying the established algorithm, $X(30 \text{ s})=(X_0+R \cdot \cos[\varphi(t)]) \cdot \cos[\psi(t)]-(Y_0+R \cdot \sin[\varphi(t)]) \cdot \sin[i)(t)]==(75+75 \cdot \cos[122.8°]) \cdot \cos[180°]-(0+75 \cdot \sin[122.8°]) \cdot \sin[180°]=-34.372$ mm and $Y(30 \text{ s})=(X_0+R \cdot \cos[\varphi(t)]) \cdot \sin[i)(t)]+(Y_0+R \cdot \sin[\varphi(t)]) \cdot \cos[i)(t)]==(75+75 \cdot \cos[122.8°]) \cdot \sin[180°]+(0+75 \cdot \sin[122.8°]) \cdot \cos[180°]=-63.042$ mm Therefore, the instantaneous position of the area of observation, i.e. the position of the lens or the position of the probed area, on the surface of the scanned wafer at t=30 seconds was X=−34.372 mm and Y=−63.042 mm.

Figure 10:
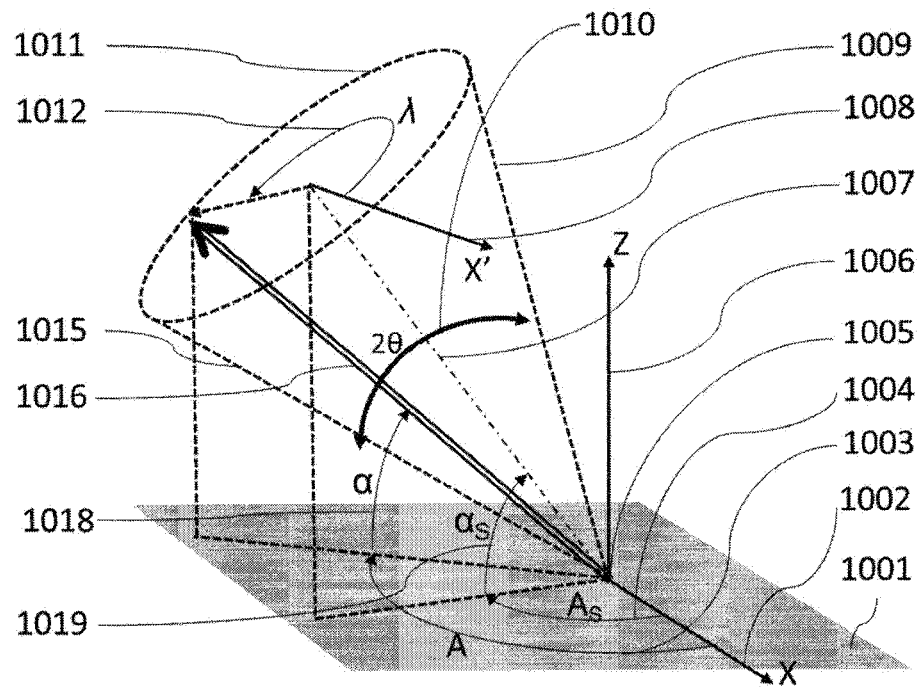
FIG. 10 is an illustration of an embodiment of a setup for tracking positions of a probing medium during a space scanning according to the present invention.

FIG. 10 illustrates an embodiment of a setup for scanning a space according to the present invention. A horizontal coordinate system with the fundamental horizon plain 1001, the zenith direction 1006 (Z) and the primary direction 1002 (X) is assigned to the scanned space. A scanning apparatus is positioned in the center point 1005 of the coordinate system. The scanning apparatus directs the probing medium in a controllable way by setting and tracking the azimuth 1004 ($A_S$) and the elevation angle 1019 ($\alpha_S$) of the axis 1007 of probing medium spinning. The spinning probing medium sweeps a portion of the space that is called in the present invention as a probed area. The probed area is a right circular conical surface with an apex in the center point 1005 of the horizontal coordinate system and an axis coinciding with the axis 1007 of probing medium spinning. The conical surface representing the probed area is visualized in FIG. 10 with the directrix 1011 and the generatrix lines 1009 and 1015. The directrix 1011 is a cross-section of the probed area perpendicular to the axis 1007 of probing medium spinning. The conical surface representing the probed area is the set of all points swept by the probing medium 1016 emanating from the origin of the coordinate system and spinning about the spin axis 1007. An essential parameter of the scanning is the aperture 1010 of the conical surface. The aperture angle equals 2θ. To conduct the scanning in a controllable and predetermined way, it is necessary to determine the coordinates of the azimuth 1003 (A) and the elevation angle 1018 (α) of an instantaneous position 1016 of the probed area at any moment t of an intended scanning process. The spinning of the probing medium is implemented by a device that feedbacks an angular position 1012 (λ) of the probed medium 1016 with respect to the spin axis 1007. The angular position 1012 (λ) is the angle of diversion from a reference direction perpendicular to the spin axis 1007. The reference direction 1008 (X') is selected in FIG. 10 to be a horizontal direction along the primary direction 1002 if or when the azimuth 1004 ($A_S$) of the spin axis 1007 is set at 90°.

The preferred aperture 1010 of the conical surface swept in space by the probing medium is less than 90°. Otherwise, a portion of the scanned space would be wasted outside of horizontal coordinate system and the efficiency of scanning would be reduced. Therefore, θ<45° may be recommended. For the same reason, the preferred elevation angle 1019 ($\alpha_S$) of the spin axis 1007 should be equal or greater than 0 and equal or less than 90°−θ.

The present invention establishes the following algorithm for determining instantaneous positions—the azimuth A(t) and the elevation angle α(t)—of the probed area in a horizontal coordinate system at any instant time t of space scanning:

$$A(t) = A_S(t) - \arctan\left[\frac{\cos[\lambda(t)] \cdot \tan[\theta]}{\cos[\alpha_S(t)] - \sin[\lambda(t)] \cdot \tan[\theta] \cdot \sin[\alpha_S(t)]}\right]$$

and $$\alpha(t) = \alpha_S(t) + \arctan(\sin[\lambda(t)] \cdot \tan[\theta])$$

or $$\alpha(t) = \arctan\left[\frac{\sin[\alpha_S(t)] + \sin[\lambda(t)] \cdot \tan[\theta] \cdot \cos[\alpha_S(t)]}{\cos[\alpha_S(t)] - \sin[\lambda(t)] \cdot \tan[\theta] \cdot \sin[\alpha_S(t)]}\right],$$

where $A_S(t)$ is the azimuth and $\alpha_S(t)<90°$ is the angle of elevation of the spin axis of the probing medium at the time t, λ(t) is the angular position of the probing medium at the time t, the angular position is measured relative to an observer in the center of the horizontal coordinate system as a clockwise diversion from the left horizontal direction, θ is a half (½) of the aperture of the conical surface of the probed area produced by the spinning probing medium.

For example, a space over an airfield is scanned for detecting objects in the air which may present hazard for flying aircrafts. The probing medium is a laser beam. A laser reflection from objects indicates their presence. A horizontal coordinate system with a fundamental horizon plain, vertical zenith and a horizontal primary direction is assigned to the scanned space. A laser pointing system is installed at the center point of the coordinate system. The laser pointing system spins the laser beam about a spin axis and may independently direct the spin axis. The aperture of the conical surface swept in the air by the laser beam is $2\theta=45°$. The laser pointing system is controlled by a computer that instructs the system to allocate the spin axis to an azimuth $A_S$ and an elevation angle as according to a scanning protocol. At every desired time t, the laser pointing system feedbacks to the computer the actual azimuth $A_S(t)$ and the elevation angle $\alpha_S(t)$ of the spin axis. The laser pointing system also tracks and feedbacks to the computer the angular position A(t) of the laser beam with respect to the spin axis. $\lambda(t)$ is measured clockwise from the horizontal left direction. Before scanning starts, a reference angular position A of the laser beam is calibrated by directing the spin axis horizontally ($\alpha_S=0$) with the azimuth $\lambda_S=90°$, then locating the laser beam by its rotation about the spin axis horizontally towards the primary direction of the coordinate system, and finally by assigning the "zero" value ($\lambda=0$) to the obtained laser angular position. The equations of the established algorithm for determining the azimuth $\lambda(t)$ and the elevation angle $\alpha_S(t)$ of the laser beam at any time t may be directly applied without modification because the described calibration of the laser angular position meets basic conditions of the algorithm. At the time t=603 sec, a flying object was detected. The laser pointing system feedbacks to the computer the corresponding azimuth of the spin axis $A_S$(603 s)=209.1°, its elevation angle $\alpha_S$(603 s)=400 and the angular position (603 s)=168° of the laser beam. The related orientation of the laser beam is computed based on the established algorithm as follows:

$$A(t) = A_S(t) - \arctan\left[\frac{\cos[\lambda(t)] \cdot \tan[\theta]}{\cos[\alpha_S(t)] \cdot (1 - \sin[\lambda(t)] \cdot \tan[\theta])}\right] =$$

$$209.1° - \arctan\left[\frac{\cos[168°] \cdot \tan[22.5°]}{\cos[40°] \cdot (1 - \sin[168°] \cdot \tan[22.5°])}\right] = 239.16°$$

and $$\alpha(t) =$$

$$\alpha_S(t) + \arctan(\sin[\lambda(t)] \cdot \tan[\theta]) = 40° + (\sin[168°] \cdot \tan[22.5°]) = 44.92°$$

Therefore, the coordinates of the flying object in the assigned horizontal coordinate system are the azimuth of 239.16° and the elevation angle of 44.92°. The coordinates of the flying object are immediately communicated to the flight coordinator on the airfield.

The algorithms established in the present invention for determining the coordinates of the probing area at any time of scanning are subject to a choice of a coordinate system, the orientation of the coordinate system and the initial setup of scanning including the reference positions and directions for rotation and spinning motions measurements. The equations of the established algorithms may need to be modified in case of a scanning setup different from the specified in the present description. The modification of equations, if needed, is a trivial task for those skilled in geometry and the basic concepts and calculation algorithms disclosed in the present invention.

What is claimed is:

1. A method of observing that comprises
providing an object for observing, wherein the object has a flat or nearly flat surface;
providing a device for localized observations;
pointing the device along an observation direction towards the object to observe a localized portion of the object;
controlled spinning of the observation direction about a spin axis directed towards the object but outside of the localized portion of the object, wherein the spin axis is directed perpendicular to the surface of the object so that the instantaneous positions of the localized portion of the object follow a circular orbit on the surface of the object;
controlled repositioning of the object with respect to the spin axis, wherein the controlled repositioning of the object with respect to the spin axis is conducted perpendicular to the spin axis and by at least one linear actuator;
and continuously determining instantaneous locations of the localized portion of the object, wherein
the instantaneous locations of the localized portion of the object are continuously determined in a Cartesian coordinate system assigned to the surface of the object;
the linear actuator continuously feedbacks distances of object repositioning in X and Y directions of the said Cartesian coordinate system;
instantaneous locations of the localized portion of the object are determined at any time t of interest as X(t) and Y(t) coordinates of the localized portion of the object in the said Cartesian coordinate system as $$X(t) = R \cdot \cos(\varphi(t)) + X_0 - S_X(t)$$

and $$Y(t) = R \cdot \sin(\varphi(t)) + Y_0 - S_Y(t),$$

where
R is the radius of the circular orbit that the localized portion sweeps on the object surface;
$\varphi(t)$ is the angular position of the localized portion measured at the moment t counterclockwise from X direction in the said Cartesian coordinate system;
$X_0=X(0)$ and $Y_0=Y(0)$ are X and Y coordinates of the spin axis at the time t=0;
$S_X(t)$ and $S_Y(t)$ are the distances of the object repositioning with respect to the spin axis by the time t in X and Y directions of the said Cartesian coordinate system correspondingly;
and the distances of the object repositioning are measured from the object position at the time t=0.

2. The method of claim 1, wherein
the device is an optical tool that collects electromagnetic radiation emanated from the localized portion of the object.

3. The method of claim 1, wherein
the controlled repositioning of the object with respect to the spin axis is conducted by moving the object.

4. The method of claim 1, wherein
the controlled repositioning of the object with respect to the spin axis is conducted by moving the spin axis.

5. The method of claim 1, wherein
the controlled repositioning of the object with respect to the spin axis is conducted by interrupted displacements.

6. The method of claim 5, wherein
the frequency F of the interrupted displacements of the object repositioning equals R/n, where R is the frequency of the observation direction spinning, and n is a natural number.

7. The method of claim 5, wherein
the frequency of the interrupted displacements equals the frequency of the observation direction spinning.

8. A method of observing that comprises
providing an object for observing, wherein the object has a flat or nearly flat surface;
providing a device for localized observations;
pointing the device along an observation direction towards the object to observe a localized portion of the object;
controlled spinning of the observation direction about a spin axis directed towards the object but outside of the localized portion of the object, wherein the spin axis is directed perpendicular to the surface of the object so that the instantaneous positions of the localized portion of the object follow a circular orbit on the surface of the object;
controlled repositioning of the object with respect to the spin axis, wherein the controlled repositioning of the object with respect to the spin axis is conducted perpendicular to the spin axis;
continuously determining instantaneous locations of the localized portion of the object, wherein
the controlled repositioning of the object with respect to the spin axis is conducted by rotation about a rotation axis, the rotation axis is configured perpendicular to the flat surface of the object, the rotation axis is not matching with the spin axis;
the instantaneous locations of the localized portion of the object are continuously determined in a Cartesian coordinate system assigned to the surface of the object;
the rotation of the object with respect to the spin axis is controlled by the angle of the object rotation;
instantaneous locations of the localized portion of the object are determined at any time t of interest as X(t) and Y(t) coordinates of the localized portion of the object in the said Cartesian coordinate system as $$X(t)=(X_0+R\cdot\cos[\varphi(t)])\cdot\cos[\psi(t)]-(Y_0+R\cdot\sin[\varphi(t)])\cdot\sin[\psi(t)]$$

and $$Y(t)=(X_0+R\cdot\cos[\varphi(t)])\cdot\sin[\psi(t)]+(Y_0+R\cdot\sin[\varphi(t)])\cdot\cos[\psi(t)],$$

where
$X_0$ and $Y_0$ are X and Y coordinates of the spin axis at t=0,
R is the radius of the circular orbit of the spinning localized portion of the object on the surface of the object,
$\varphi(t)$ is the angular position of the localized portion of the object measured counterclockwise from X(0) direction of axis X at t=0,
and $\psi(t)$ is the angle of the object rotation measured counterclockwise with respect to the orientation of the surface of the object at t=0.

9. A method of observing that comprises
providing an object for observing;
providing a device for localized observations;
pointing the device along an observation direction towards the object to observe a localized portion of the object;
controlled spinning of the observation direction about a spin axis directed towards the object but outside of the localized portion of the object;
controlled repositioning of the object with respect to the spin axis; and
continuously determining instantaneous locations of the localized portion of the object, wherein
the object for observing is a three-dimensional space;
and the controlled repositioning of the object with respect to the spin axis of the observation direction is conducted by a three-dimensional rotation of the spin axis about a point on the spin axis.

10. The method of claim 9, wherein
the instantaneous locations of the localized portions of the space are continuously determined as an azimuth and an elevation angle of the observation direction in a horizontal coordinate system assigned to the space;
the center of the horizontal coordinate system is positioned in the point on the spin axis about which the three-dimensional rotation of the spin axis is conducted;
the azimuth is measured with respect to a horizontal primary direction;
the elevation angle is measured with respect to the fundamental plane of the horizontal coordinate system;
the repositioning of the space with respect to the spin axis is controlled by determining and tracking instantaneous values of the azimuth and the elevation angle of the spin axis of the observation direction in the horizontal coordinate system;
the azimuth $\lambda(t)$ and the elevation angle $\alpha(t)$ of the localized portions of the space at the time t of interest are determined as $$A(t) = A_S(t) - \arctan\left[\frac{\cos[\lambda(t)] \cdot \tan[\theta]}{\cos[\alpha_s(t)] - \sin[\lambda(t)] \cdot \tan[\theta] \cdot \sin[\alpha_s(t)]}\right]$$

and $$\alpha(t)=\alpha_S(t)+\arctan(\sin[\lambda(t)]\cdot\tan[\theta]),$$

where
$A_S(t)$ is the azimuth and $\alpha_S(t)<90°$ is the angle of elevation of the spin axis of the observation direction at the time t;
$\alpha_S(t)<90°$ is the angle of elevation of the spin axis of the observation direction at the time t;
$\lambda(t)$ is the angular position of the observation direction at the time t, the angular position is measured relative to an observer in the center of the horizontal coordinate system as a clockwise diversion from the left horizontal direction;
and $\theta$ is the angle between the observation direction and the spin axis of the observation direction.

11. The method of claim 10, wherein
the angle between the observation direction and the spin axis of the observation direction is not greater than 45°.

12. The method of claim 10, wherein
the angle of elevation of the spin axis of the observation direction is not less than the angle $\theta$ between the observation direction and the spin axis of the observation direction;
and the sum of the angle $\alpha_S$ of elevation of the spin axis of the observation direction and the angle $\theta$ between the observation direction and the spin axis of the observation direction is not greater than 90°.

* * * * *